(12) United States Patent
Ku

(10) Patent No.: US 9,231,580 B2
(45) Date of Patent: Jan. 5, 2016

(54) SEMICONDUTOR APPARATUS FOR CONTROLLING BACK BIAS

(71) Applicant: SK hynix Inc., Icheon-si Gyeonggi-do (KR)

(72) Inventor: Kie Bong Ku, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/267,627

(22) Filed: May 1, 2014

(65) Prior Publication Data

US 2015/0188518 A1    Jul. 2, 2015

(30) Foreign Application Priority Data

Dec. 30, 2013    (KR) .................... 10-2013-0166554

(51) Int. Cl.
| | |
|---|---|
| G05F 1/10 | (2006.01) |
| H03K 17/56 | (2006.01) |
| H03K 19/00 | (2006.01) |

(52) U.S. Cl.
CPC ............ *H03K 17/56* (2013.01); *H03K 19/0027* (2013.01)

(58) Field of Classification Search
CPC ....... G05F 3/08; G06F 1/3234; G06F 1/3287; G06F 1/3296
See application file for complete search history.

(56) References Cited

U.S. PATENT DOCUMENTS

| | | | | |
|---|---|---|---|---|
| 6,333,571 | B1 * | 12/2001 | Teraoka et al. ................ | 307/125 |
| 6,373,321 | B1 * | 4/2002 | Yamauchi et al. ............ | 327/534 |
| 6,850,453 | B2 | 2/2005 | Park | |
| 7,002,397 | B2 | 2/2006 | Kubo et al. | |
| 7,123,076 | B2 * | 10/2006 | Hatakeyama et al. ........ | 327/534 |
| 7,616,048 | B2 | 11/2009 | Choi et al. | |
| 7,675,347 | B2 * | 3/2010 | Teramoto et al. ............. | 327/534 |
| 7,689,845 | B2 | 3/2010 | Narendra et al. | |
| 7,714,606 | B2 | 5/2010 | Ozawa et al. | |
| 8,217,322 | B2 | 7/2012 | Houston et al. | |
| 8,299,847 | B2 * | 10/2012 | Matano .......................... | 327/544 |

FOREIGN PATENT DOCUMENTS

KR    1020130043469 A    4/2013

* cited by examiner

*Primary Examiner* — Jeffrey Zweizig
(74) *Attorney, Agent, or Firm* — William Park & Associates Ltd.

(57) ABSTRACT

A semiconductor apparatus includes a back bias control block, a first back bias switching block and second back bias switching block. The back bias control block is configured to generate a first P channel control signal and a second N channel control signal. The first back bias switching block is configured to provide one of first and second high voltages as a first P channel back bias of a first circuit in response to the first P channel control signal, and to provide one of first and second low voltages as a first N channel back bias of the first circuit in response to the first N channel control signal. The second back bias switching block is configured to provide one of the first and second high voltages as a second P channel back bias of a second circuit in response to the second P channel control signal, and to provide one of the first and second low voltages as a second N channel back bias of the second circuit in response to the second N channel control signal.

17 Claims, 7 Drawing Sheets

SEMICONDUTOR APPARATUS FOR CONTROLLING BACK BIAS

CROSS-REFERENCES TO RELATED APPLICATION

The present application claims priority under 35 U.S.C. §119(a) to Korean application number 10-2013-0166554, filed on Dec. 30, 2013, in the Korean Intellectual Property Office, which is incorporated herein by reference in its entirety.

BACKGROUND

1. Technical Field

Various embodiments relate to a semiconductor apparatus, and more particularly, to a semiconductor apparatus for controlling a back bias.

2. Related Art

A semiconductor apparatus typically includes circuits designed using MOS (metal oxide semiconductor) transistors. An MOS transistor may be turned on when a voltage that is relatively higher than a threshold voltage is received at the gate and a current path is formed between the drain and the source. A back bias may be applied to the bulk of the MOS transistor to control the threshold voltage. The back bias may prevent data from being lost in an unnecessary PN junction, and may prevent a latch-up phenomenon of the transistor from occurring.

FIG. 1 is a circuit diagram representation of an example of a typical semiconductor circuit, an inverter 10. The inverter 10 may include a P channel MOS transistor (a PMOS transistor) 11 and an N channel MOS transistor (an NMOS transistor) 12. The inverter 10 may generate an output signal OUT when one of the two transistors is turned on based on the level of an input signal IN. In general, during the operation of the inverter 10, a power supply voltage VDD may be applied to the bulk of the PMOS transistor 11 as a back bias and a ground voltage VSS may be applied to the bulk of the NMOS transistor 12 as a back bias. It is desirable that, when there is no input signal IN supplied to the inverter 10, the PMOS transistor 11 and the NMOS transistor 12 turn off and current consumption ceases. However, there is typically leakage current due to the characteristics of the transistors.

SUMMARY

In an embodiment, a semiconductor apparatus includes a back bias control block configured to generate a first P channel control signal and a second P channel control signal, a first N channel control signal and a second N channel control signal according to an operation mode based on a command signal, a first back bias switching block configured to provide one of a first high voltage and a second high voltages as a first P channel back bias of a first internal circuit in response to the first P channel control signal, and to provide one of a first low voltage and a second low voltage as a first N channel back bias of the first internal circuit in response to the first N channel control signal, and a second back bias switching block configured to provide one of the first high voltage and the second high voltage as a second P channel back bias of a second internal circuit in response to the second P channel control signal, and to provide one of the first low voltage and the second low voltage as a second N channel back bias of the second internal circuit in response to the second N channel control signal.

DETAILED DESCRIPTION

Various embodiments of a semiconductor apparatus configured to control a back bias will be described below with reference to the accompanying drawings.

Figure 1:
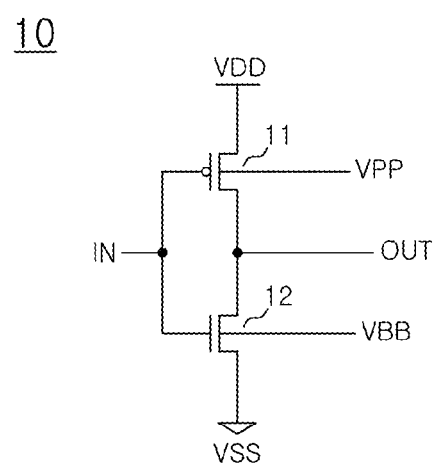
FIG. 1 is a circuit diagram representation of an example of a typical prior art semiconductor circuit, an inverter.
Figure 2:
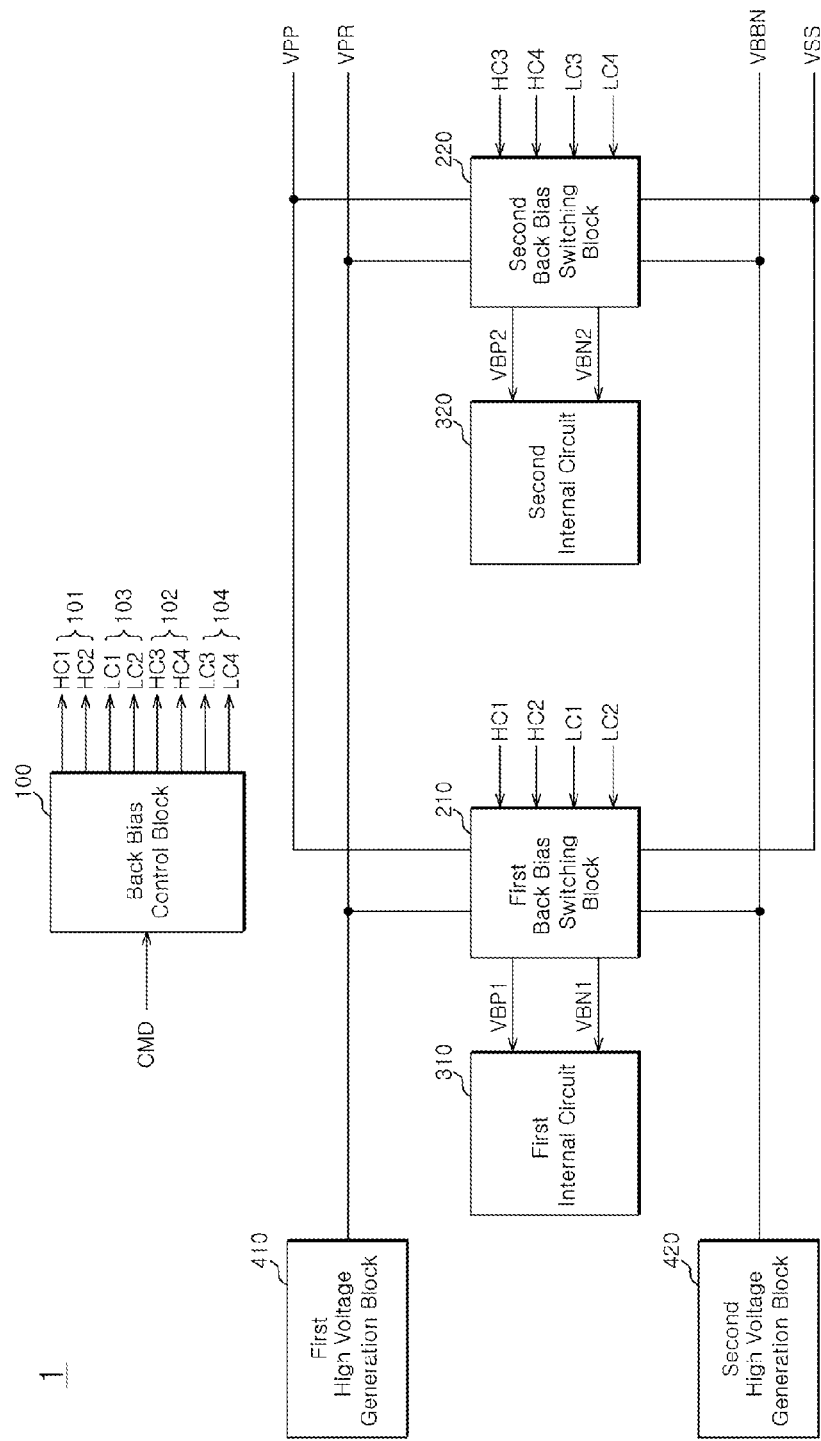
FIG. 2 is a block diagram representation of an embodiment of a semiconductor apparatus.

Referring to FIG. 2, an embodiment of a semiconductor apparatus 1 may include a back bias control block 100, a first back bias switching block 210, and a second back bias switching block 220. The back bias control block 100 may generate first and second P channel control signals 101 and 102 and first and second N channel control signals 103 and 104 according to various operation modes based on a command signal CMD.

The back bias control block 100 may be configured change the levels of the first and second P channel control signals 101, 102 and the first and second N channel control signals 103, 104 according to the operation mode. The first back bias switching block 210 may be configured to receive the first P channel control signal 101 and the first N channel control signal 103 as inputs. The first back bias switching block 210 may be configured to provide one of first and second high voltages VPR and VPP to a first internal circuit 310 in response to the first P channel control signal 101, and to provide one of first and second low voltages VSS and VBBN to the first internal circuit 310 in response to the first N channel control signal 103.

The second back bias switching block 220 may be configured to receive the second P channel control signal 102 and the second N channel control signal 104 as inputs. The second back bias switching block 220 may be configured to provide one of the first and second high voltages VPR and VPP to a second internal circuit 320 in response to the second P channel control signal 102, and to provide one of the first and second low voltages VSS and VBBN to the second internal circuit 320 in response to the second N channel control signal 104.

The semiconductor apparatus 1 may be configured to operate in various operation modes. For example, the semiconductor apparatus 1 may be configured to operate in first, second or third operation modes. The first and second internal circuits 310 and 320 may be configured to operate in the first operation mode. The first and second internal circuits 310 and 320 may be configured to operate in the second operation mode. The first and second internal circuits 310 and 320 may not be configured to operate in the third operation mode.

In an embodiment, the first internal circuit 310 operates in the second operation mode and the second internal circuit 320 does not operate in the second operation mode. The first operation mode may be a normal operation mode that supports the performance of general functions at the semiconductor apparatus 1. An example of a general function is data communication. The second operation mode may be a partial low power operation mode that supports the performance of partial functions at the semiconductor apparatus 1. An example of a partial function is a refresh operation. The third operation mode may be a low power operation mode where the power consumption of the semiconductor apparatus 1 is relatively low. Examples of lower power operation modes may include, but are not limited to, a sleep mode, a standby mode, a power-down mode, a deep power-down mode, an idle mode and a power-saving mode.

The back bias control block 100 may be configured to alter the levels of the first and second P channel control signals 101, 102 and the first and second N channel control signals 103, 104 to provide appropriate back biases to the internal circuits that operate in the first and second operation modes and to the internal circuits that do not operate in the second and third operation modes.

The first P channel control signal 101 may include a first high voltage control signal HC1 and a second high voltage control signal HC2, and the first N channel control signal 103 may include a first low voltage control signal LC1 and a second low voltage control signal LC2. The second P channel control signal 102 may include a third high voltage control signal HC3 and a fourth high voltage control signal HC4, and the second N channel control signal 104 may include a third low voltage control signal LC3 and a fourth low voltage control signal LC4.

The first back bias switching block 210 may be configured to provide one of the first and second high voltages VPR, VPP as a first P channel back bias VBP1 for the first internal circuit 310 in response to the first P channel control signal 101, where the first P channel control signal includes the first and second high voltage control signals HC1, HC2. The first back bias switching block 210 may be configured to provide one of the first and second low voltages VSS, VBBN as a first N channel back bias VBN1 for the first internal circuit 310 in response to the first N channel control signal 103, where the first N channel control signal includes the first and second low voltage control signals LC1, LC2.

The second back bias switching block 220 may be configured to provide one of the first and second high voltages VPR, VPP as a second P channel back bias VBP2 for the second internal circuit 320, in response to the second P channel control signal 102, where the second P channel control signal includes the third and fourth high voltage control signals HC3, HC4. The second back bias switching block 220 may be configured to provide one of the first and second low voltages VSS, VBBN as a second N channel back bias VBN2 for the second internal circuit 320 in response to the second N channel control signal 104, where the second N channel control signal includes the third and fourth low voltage control signals LC3, LC4.

In the embodiment, the second high voltage VPP may have a voltage level that is relatively higher than the first high voltage VPR. The second high voltage VPP may be a first power supply voltage that is supplied to the semiconductor apparatus 1 from an external device. The first high voltage VPR may be a second power supply voltage or an internal voltage. The second power supply voltage may be supplied to the semiconductor apparatus 1 from the external device, The internal voltage may be generated internally within the semiconductor apparatus 1 using the second power supply voltage.

In the embodiment, the second low voltage VBBN may have a voltage level that is relatively lower than the first low voltage VSS. The second low voltage VBBN may be generated by a voltage generation unit. An example of a voltage generation unit is a pumping circuit. In other words, the second low voltage VBBN may be generated internally within the semiconductor apparatus 1. The first low voltage VSS may be, for example, a ground voltage.

The semiconductor apparatus 1 may include a first high voltage generation block 410 configured to generate one of the second power supply voltage and the internal voltage as the first high voltage VPR. The semiconductor apparatus 1 may include a second low voltage generation block 420 configured to generate the second low voltage VBBN. The first and second high voltages VPR, VPP and the first and second low voltages VSS, VBBN are supplied to power meshes or power lines in the semiconductor apparatus 1. The first and second back bias switching blocks 210 and 220 may be electrically coupled with the power meshes or the power lines.

Figure 3:
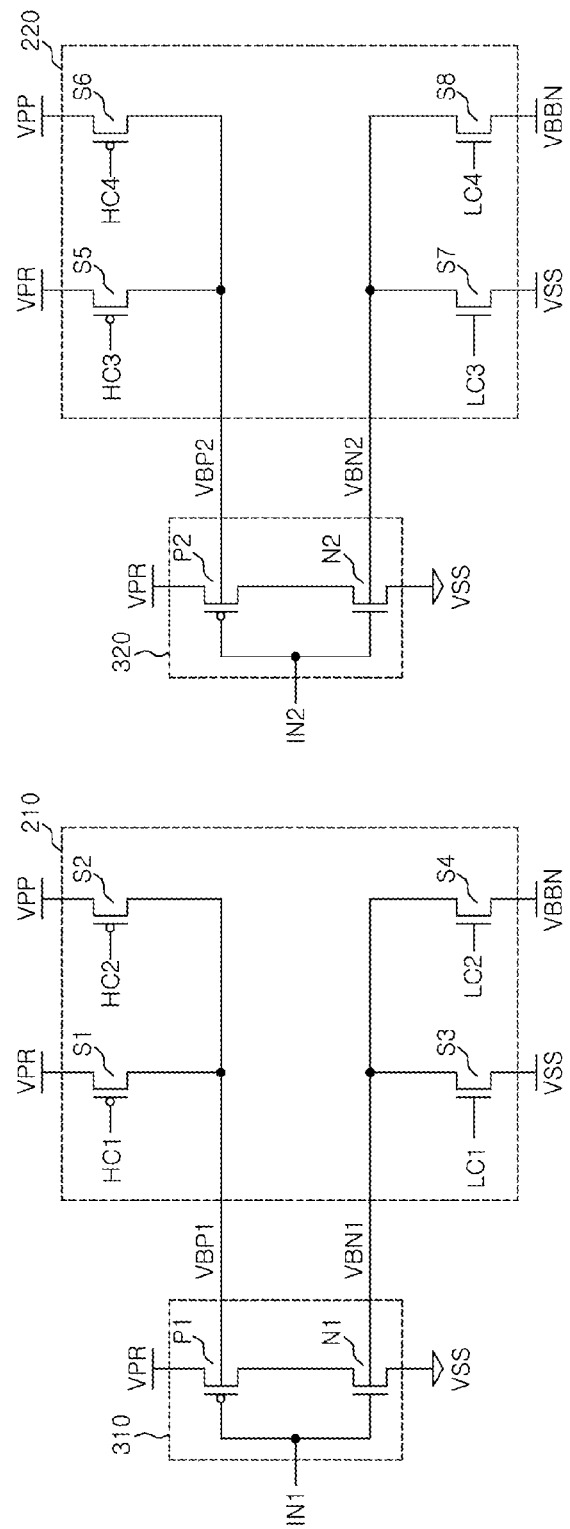
FIG. 3 is a circuit diagram representation of the first and second internal circuits and the first and second back bias switching blocks shown in FIG. 2.

Referring to FIG. 3 is a circuit diagram representation of the first and second internal circuits 310, 320 and the first and second back bias switching blocks 210, 220 of FIG. 2 are shown. While an example of a circuit configuration of the first and second internal circuits 310, 320 is shown in FIG. 3, alternative circuit configurations of the first and second internal circuits 310, 320 may be used. In FIG. 3, the first and second internal circuits 310, 320 model the configuration of inverters. The first internal circuit 310 may include a first PMOS transistor P1 and a first NMOS transistor N1. The first PMOS transistor P1 and the first NMOS transistor N1 are electrically coupled in series between the first high voltage VPR and the first low voltage VSS. The first high voltage VPR is a power supply voltage. The first PMOS transistor P1 and the first NMOS transistor N1 may be configured to receive a first input signal IN1. The first input signal IN1 is an internal control signal that is operable to operate the first internal circuit 310.

The second internal circuit 320 may include a second PMOS transistor P2 and a second NMOS transistor N2. The second PMOS transistor P2 and the second NMOS transistor N2 are electrically coupled in series between the first high voltage VPR and the first low voltage VSS. The second PMOS transistor P2 and the second NMOS transistor N2 may be configure to receive a second input signal IN2. The second input signal IN2 is an internal control signal that is operable to operate the second internal circuit 320.

The first back bias switching block 210 may include first, second, third and fourth switch transistors S1, S2, S3, S4. The first and second switch transistors S1, S2 may be PMOS transistors. The third and fourth switch transistors S3, S4 may be NMOS transistors. The first switch transistor S1 may be configured to receive the first high voltage control signal HC1 at the gate, the first high voltage VPR at the source, and to output the first P channel back bias VBP1 via the drain. The second switch transistor S2 may be configured to receive the second high voltage control signal HC2 at the gate, the second high voltage VPP at the source, and may output the first P channel back bias VBP1 via the drain. The first P channel back bias VBP1 generated by the first and second switch transistors S1, S2 may be supplied to the bulk of the first PMOS transistor P1. The third switch transistor S3 may be configured to receive the first low voltage control signal LC1 at the gate, receive the first low voltage VSS at the source, and output the first N channel back bias VBN1 via the drain. The fourth switch transistor S4 may be configured to receive the second low voltage control signal LC2 at the gate, the second low voltage VBBN at the source, and output the first N channel back bias VBN1 via the drain. The first N channel back bias VBN1 generated by the third and fourth switch transistors S3, S4 may be supplied to the bulk of the first NMOS transistor N1.

The second back bias switching block 220 may include fifth, sixth, seventh and eighth switch transistors S5, S6, S7, S8. The fifth and sixth switch transistors S5, S6 may be PMOS transistors. The seventh and eighth switch transistors S7, S8 may be NMOS transistors. The fifth switch transistor S5 may be configured to receive the third high voltage control signal HC3 at the gate, the first high voltage VPR at the source, and output the second P channel back bias VBP2 via the drain. The sixth switch transistor S6 may be configured to receive the fourth high voltage control signal HC4 at the gate, the second high voltage VPP at the source, and output the second P channel back bias VBP2 via the drain. The second P channel back bias VBP2 generated by the fifth and sixth switch transistors S5, S6 may be supplied to the bulk of the second PMOS transistor P2. The seventh switch transistor S7 may be configured to receive the third low voltage control signal LC3 at the gate, the first low voltage VSS at the source, and output the second N channel back bias VBN2 via the drain. The eighth switch transistor S8 may be configured to receive the fourth low voltage control signal LC4 at the gate, the second low voltage VBBN at the source, and output the second N channel back bias VBN2 via the drain. The second N channel back bias VBN2 generated by the seventh and eighth switch transistors S7, S8 may be supplied to the bulk of the second NMOS transistor N2.

Figure 4:
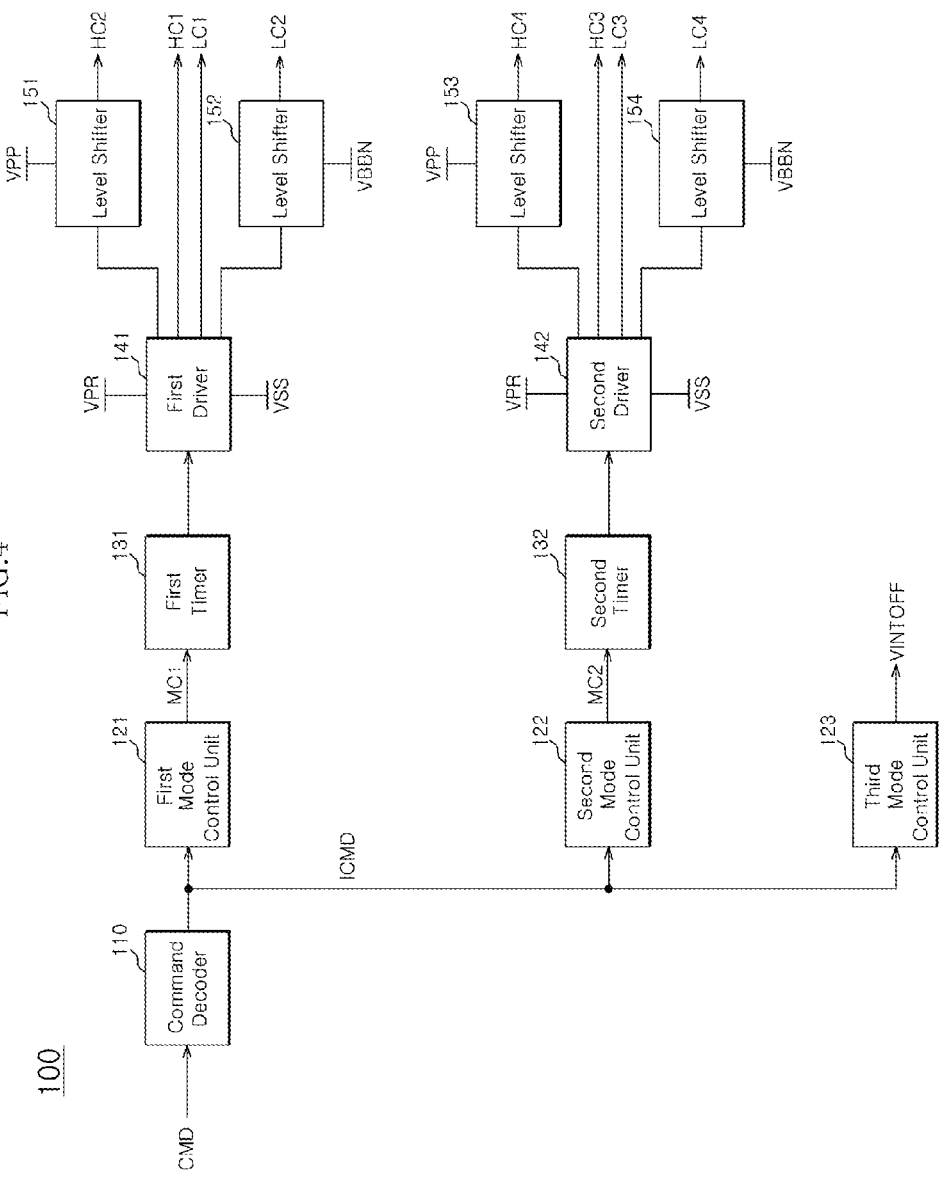
FIG. 4 is a block diagram representation of the back bias control block shown in FIG. 2.

FIG. 4 is a block diagram representation of the back bias control block 100 of FIG. 2. The back bias control block 100 may include a command decoder 110, a mode control unit, a timer, and a driver. The command decoder 110 may decode a received command signal CMD and generate an internal command signal ICMD. The command decoder 110 may generate a specific internal command signal ICMD associated with an operation mode based on the command signal CMD. The internal command signals ICMD may be operable to place the semiconductor apparatus 1 in one of a number of different operation modes. Examples of the operation modes, include but are not limited to, a normal operation mode, a partial low power operation mode and a low power mode. In an example of an embodiment of the internal command signal ICMD, the internal command signal ICMD is operable to place the semiconductor apparatus 1 in one of the first, second or third operation modes.

The mode control unit may be configured to generate mode change signals MC1, MC2 according to the operation modes. The mode change signals MC1, MC2 may be supplied to the driver and may change the levels of the first and second P channel control signals 101, 102 and the first and second N channel control signals 103, 104. The timer may selectively delay the generation of the mode change signals MC1, MC2 in accordance with the operation mode of the semiconductor apparatus 1. The driver may generate the first and second P channel control signals 101, 102 and the first and second N channel control signals 103, 104 based on the mode change signals MC1, MC2.

Referring to FIG. 4, the mode control unit may include first and second mode control units 121, 122, the timer may include first and second timers 131, 132, and the driver may include first and second drivers 141, 142. The first mode control unit 121, the first timer 131 and the first driver 141 are configured to generate the first P channel control signal 101 and the first N channel control signal 103. The first P channel control signal 101 and the first N channel control signal 103 control the operation of the first back bias switching block 210. The second mode control unit 122, the second timer 132 and the second driver 142 are configured to generate the second P channel control signal 102 and the second N channel control signal 104. The second P channel control signal 102 and the second N channel control signal 104 control the operation of the second back bias switching block 220.

The first mode control unit 121 may be configured to store information regarding the operations modes of the semiconductor apparatus 1 where the first internal circuit 310 is operated. The first mode control unit 121 may be configured to receive the internal command signal ICMD as an input and generate the mode change signal MC1 based on the received internal command signal ICMD. The first timer 131 may be configured to receive the mode change signal MC1 from the mode control unit 121 and selectively delay the transmission of mode change signal MC1 to the first driver 141.

The first driver 141 may be configured to receive the mode change signal MC1 from the first timer 131 and generate the first and second high voltage control signals HC1, HC2 and the first and second low voltage control signals LC1, LC2 based on the received mode change signal MC1. The first driver 141 may be configured to receive the mode change signal MC1 for the first and second operation modes and responsively generate the first high voltage control signal HC1 having the first low voltage VSS, and the second high voltage control signal HC2 having the first high voltage VPR. The first driver 141 may be configured to also generate the first low voltage control signal LC1 having the first high voltage VPR, and the second low voltage control signal LC2 having to the first low voltage VSS.

A level shifter 151 may be configured to shift the level of the second high voltage control signal HC2 to the level of the second high voltage VPP and generate the shifted second high voltage control signal HC2 as an output. A level shifter 152 may be configured to shift the second low voltage control signal LC2 to the level of the second low voltage VBBN and generate the shifted second low voltage control signal LC2 as an output.

The first driver 141 may be configured to receive the mode change signal MC1 for the third operation mode and responsively generate the first high voltage control signal HC1 having the first high voltage VPR and the second high voltage control signal HC2 having the first low voltage VSS. The first driver 141 may be configured to also generate the first low voltage control signal LC1 having the first low voltage VSS and the second low voltage control signal LC2 having the first high voltage VPR.

The second mode control unit 122 may be configured to store information regarding the operation modes of the semiconductor apparatus 1 where the second internal circuit 320 is operated. The second mode control unit 122 may be configured to receive the internal command signal ICMD as an input and responsively generate the mode change signal MC2 based on the received internal command signal ICMD. The second timer 132 may be configured to receive the mode change signal MC2 from the second mode control unit 122 and selectively delay the transmission of the mode change signal MC2 to the second driver 142.

The second driver 142 may be configured to generate the third and fourth high voltage control signals HC3, HC4 and the third and fourth low voltage control signals LC3, LC4 based on the mode change signal MC2. The second driver 142 may be configured to receive the mode change signal MC2 for the first operation mode and responsively generate the third high voltage control signal HC3 having the first low voltage VSS and the fourth high voltage control signal HC4 having the first high voltage VPR. The second driver 142 may also be configured to generate the third low voltage control signal LC3 having the first high voltage VPR and the fourth low voltage control signal LC4 having the first low voltage VSS.

A level shifter 153 may be configured to shift the level of the fourth high voltage control signal HC4 to the level of the second high voltage VPP and generate the shifted the fourth high voltage control signal HC4 as an output. A level shifter 154 may be configured to shift the level of the fourth low voltage control signal LC4 to the level of the second low voltage VBBN and generated the shifted fourth low voltage control signal LC4 as an output.

The second driver 142 may be configured to receive the mode change signal MC2 for the second and third operation modes and responsively generate the third high voltage control signal HC3 having the first high voltage VPR and the fourth high voltage control signal HC4 having the first low voltage VSS. The second driver 142 may also be configured to generate the third low voltage control signal LC3 having the first low voltage VSS and the fourth low voltage control signal LC4 having the first high voltage VPR.

When the second and fourth high voltage control signals HC2 and HC4 generated by the first and second drivers 141, 142, respectively, have the level of the first high voltage VPR, the level shifters 151 and 153 shift the second and fourth high voltage control signals HC2 HC4, respectively, to the level of the second high voltage VPP. When the second and fourth high voltage control signals HC2 and HC4 have the level of the first high voltage VPR, the second switch transistor S2 of the first back bias switching block 210 and the sixth switch transistor S6 of the second back bias switching block 220 are turned off. When the second switch transistor S2 of the first back bias switching block 210 and the sixth switch transistor S6 of the second back bias switching block 220 are turned off, the second high voltage VPP is not provided as the first and second P channel back biases VBP1, VBP2. Since the second and sixth switch transistors S2, S6 receive the second high voltage VPP via their respective sources, the second and sixth switch transistors S2, S6 may not be completely turned off and leakage currents may occur when the second and sixth switch transistors S2, S6 receive the second and fourth high voltage control signals HC2, HC4 having the level of the first high voltage VPR. The level shifters 151 and 153 shift the second and fourth high voltage control signals HC2, HC4, respectively, to the level of the second high voltage VPP and the second and sixth switch transistors S2, S6 may be turned off in a manner that reduces leakage current.

Similarly, when the second and fourth low voltage control signals LC2, LC4 generated by the first and second drivers 141, 142, respectively, have the level of the first low voltage VSS, the level shifters 152 and 154 shift the second and fourth low voltage control signals LC2, LC4, respectively, to the level of the second low voltage VBBN. When the second and fourth low voltage control signals LC2, LC4 have the level of the first low voltage VSS, the fourth switch transistor S4 of the first back bias switching block 210 and the eighth switch transistor S8 of the second back bias switching block 220 are turned off. When the fourth switch transistor S4 and the eighth switch transistor S8 are turned off the second low voltage VBBN is not provided as the first and second N channel back biases VBN1, VBN2. Since the fourth and eighth switch transistors S4, S8 receive the second low voltage VBBN via their respective sources, the fourth and eighth switch transistors S4, S8 may not be completely turned off and leakage currents may occur when the fourth and eighth switch transistors S4, S8 receive the second and fourth low voltage control signals LC2, LC4 having the first low voltage VSS. The level shifters 152 and 154 shift the second and fourth low voltage control signals LC2, LC4, respectively, to the level of the second low voltage VBBN and the fourth and eighth switch transistors S4, S8 may be turned off in a manner that reduces leakage current.

Figure 5:
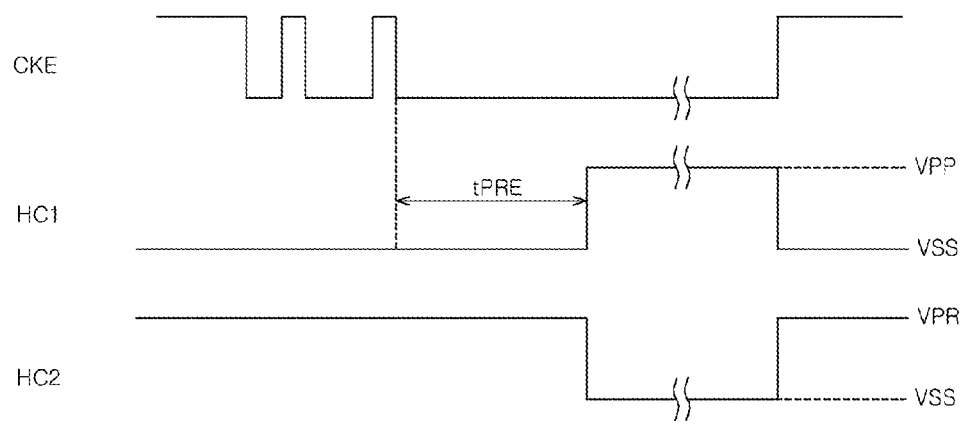
FIG. 5 is a timing diagram showing an example of the operations of the first timer shown in FIG. 4.

The first and second timers 131, 132 may be configured to determine the output timings of the mode change signals MC1, MC2, respectively, based on the operation mode of the semiconductor apparatus 1. Referring to FIG. 5 a timing diagram showing operations of the first timer 131 of FIG. 4 is shown. A clock enable signal CKE may be provided as the command signal CMD and distinguish the normal operation mode from the low power operation mode of the semiconductor apparatus 1.

The first timer 131 may be configured to transmit the mode change signal MC1 received from the first mode control unit 121 to the driver 141 when the operation mode is changed from the normal operation mode to the low power operation mode and the low power operation mode is maintained for a predetermined time tPRE. The first timer 131 may be configured to transmit the mode change signal MC1 to the driver 141 without the incorporation of a delay when the operation mode is changed from the low power operation mode to the normal operation mode. The operation mode of the semiconductor apparatus 1 may be changed a number of times during a relatively short period of time. For example, in the case of a mobile appliance, such as for example a smart phone, a conversion between an activation mode and a sleep mode may be implemented several times for a relatively short periods of time. When the semiconductor apparatus 1 is mounted within a mobile appliance, the semiconductor apparatus 1 may be configured to be placed in the normal operation mode and the low power operation mode in response to mode changes of the mobile appliance. When the conversion between the normal operation mode and the low power operation mode is repeatedly implemented within a relatively short period of time, it may be relatively inefficient to change the levels of the back biases VBP1, VBN1 provided to the first internal circuit 310, with each conversion. The first timer 131 may be configured to output the mode change signal MC1 to change the levels of the back biases VBP1, VBN1 when the mode change signal MC1 for the low power operation mode is maintained for the predetermined time tPRE following a conversion from the normal operation mode to the low power operation mode.

If the predetermined period of time tPRE passes following the clock enable signal CKE being disabled, the first high voltage control signal HC1 may have the second high voltage VPP and the second high voltage control signal HC2 may have the first low voltage VSS. When the operation mode is converted from the low power operation mode to the normal operation mode, the first timer 131 outputs the mode change signal MC1 without incorporating a delay and the semiconductor apparatus 1 may have a relatively faster response speed. Therefore, if the clock enable signal CKE is enabled, the first high voltage control signal HC1 may be changed to the level of the first low voltage VSS and the second high voltage control signal HC2 may be changed to the level of the first high voltage VPR without the incorporation of a delay.

In an embodiment, the first timer 131 may be configured to output the mode change signal MC1 for the third operation mode when the operation mode is changed from the first operation mode to the third operation mode or from the second operation mode to the third operation mode and the third operation mode is retained for the predetermined period time tPRE. The second timer 132 may be configured to output the mode change signal MC2 for the second operation mode when the operation mode is changed from the first operation mode to the second operation mode and the second operation mode is maintained for the predetermined period of time tPRE. The second timer 132 may be configured to output the mode change signal MC2 for the third operation mode when the operation mode is changed from the first operation mode to the third operation mode and the third operation mode is maintained for the predetermined period of time tPRE.

The first timer 131 may be configured to output the mode change signal MC1 without incorporating a delay for the first operation mode when the operation mode is changed from the third operation mode to the first operation mode. The first timer 131 may be configured to output the mode change signal MC1 without incorporating a delay for the second operation mode when the operation mode is changed from the third operation mode to the second operation mode. The second timer 132 may be configured to output the mode change signal MC2 having information on the first operation mode without incorporating a delay when the operation mode is changed from the second operation mode to the first operation mode. The second timer 132 may be configured to output the mode change signal MC2 having information on the first operation mode without incorporating a delay when the operation mode is changed from the third operation mode to the first operation mode.

Referring back to FIG. 4, the back bias control block 100 may include a third mode control unit 123. The third mode control unit 123 may be configured to generate an internal voltage switching signal VINTOFF in response to the internal command signal ICMD. The internal voltage switching signal VINTOFF may be provided to the first high voltage generation block 410. The third mode control unit 123 may be configured to enable the internal voltage switching signal VINTOFF when the internal command signal ICMD has information on the third operation mode.

Figure 6:
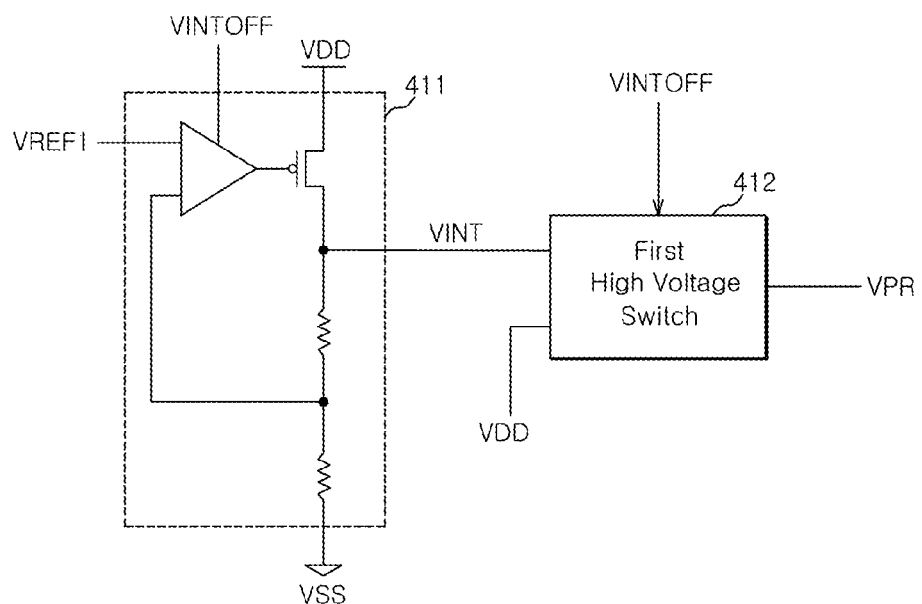
FIG. 6 is a circuit diagram representation of the first high voltage generation block shown in FIG. 2.

FIG. 6 is a circuit diagram representation of the first high voltage generation block 410 shown in FIG. 2. The first high voltage generation block 410 may include an internal voltage generation unit 411 and a first high voltage switch 412. The internal voltage generation unit 411 may be configured to receive a first reference voltage VREF1 and a second power supply voltage VDD and generate an internal voltage VINT. The internal voltage generation unit 411 may be configured to receive the internal voltage switching signal VINTOFF and may not generate the internal voltage VINT when the internal voltage switching signal VINTOFF is enabled. The first high voltage switch 412 may be configured to output one of the internal voltage VINT and the second power supply voltage VDD as the first high voltage VPR in response to the internal voltage switching signal VINTOFF.

Figure 7:
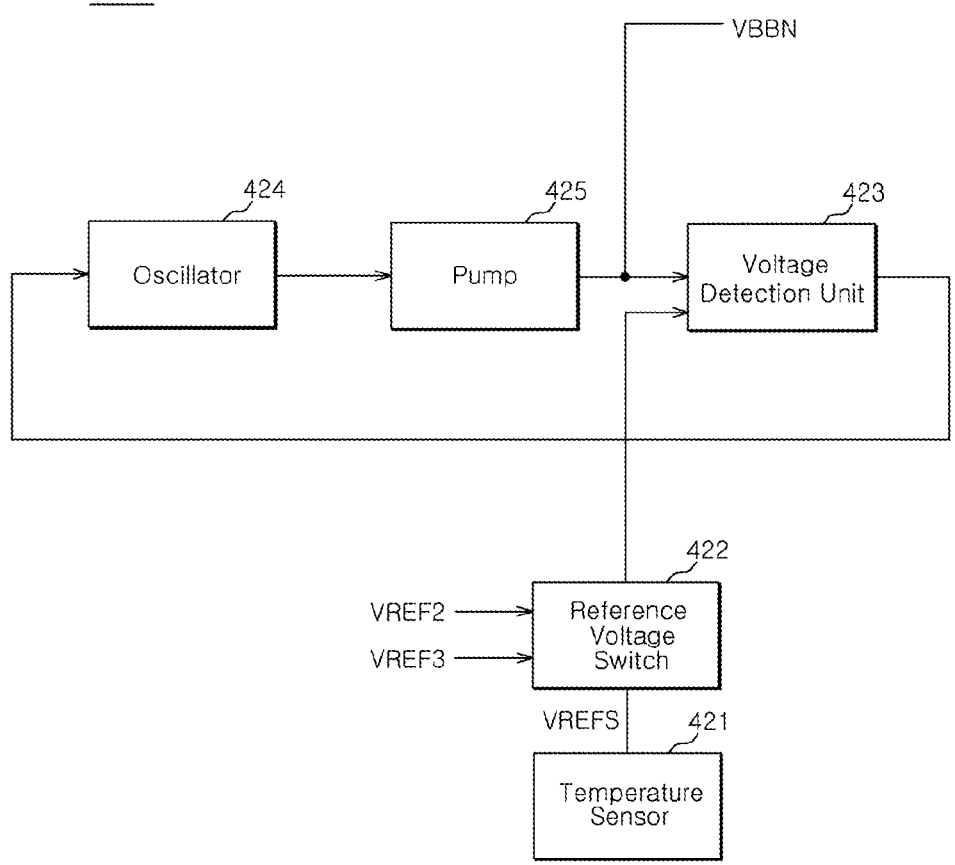
FIG. 7 is a block diagram representation of the second low voltage generation block shown in FIG. 2.

FIG. 7 is a block diagram representation of the second low voltage generation block 420 shown in FIG. 2. The second low voltage generation block 420 may be configured to generate the second low voltage VBBN. The second low voltage VBB changes according to a temperature. For example, the second low voltage generation block 420 may be configured to generate the second low voltage VBBN having a relatively lower level at a high temperature, and the second low voltage VBBN having a relatively higher level at a low temperature.

The second low voltage generation block 420 may include a temperature sensor 421, a reference voltage switch 422, a voltage detection unit 423, an oscillator 424, and a pump 425. The temperature sensor 421 senses the temperature of the semiconductor apparatus 1, and outputs a reference voltage switching signal VREFS. For example, the temperature sensor 421 may enable the reference voltage switching signal VREFS if the temperature of the semiconductor apparatus 1 is relatively high and disable the reference voltage switching signal VREFS if the temperature of the semiconductor apparatus 1 is relatively low. The reference voltage switch 422 may be configured to output one of second and third reference voltages VREF2, VREF3 to the voltage detection unit 423 in response to the reference voltage switching signal VREFS. The reference voltage switch 422 may be configured to output the second reference voltage VREF2 when the reference voltage switching signal VREFS is disabled and the third reference voltage VREF3 when the reference voltage switching signal VREFS is enabled. The third reference voltage VREF3 may have a level that is relatively lower than the second reference voltage VREF2. The voltage detection unit 423 may be configured to compare the levels of the second low voltage VBBN and the output of the reference voltage switch 422. The oscillator 424 may be configured operate the pump 425 according to a comparison result of the voltage detection unit 423. The pump 425 may generate the second low voltage VBBN.

While certain embodiments have been described above, it will be understood to those skilled in the art that the embodiments described are by way of example only. Accordingly, the semiconductor apparatus for controlling a back bias described herein should not be limited based on the described embodiments. Rather, the semiconductor apparatus for controlling a back bias described herein should only be limited in light of the claims that follow when taken in conjunction with the above description and accompanying drawings.

What is claimed is:

1. A semiconductor apparatus comprising:
  a back bias control block configured to generate a first P channel control signal, a second P channel control signal, a first N channel control signal and a second N channel control signal according to an operation mode based on a command signal;
  a first back bias switching block configured to provide one of a first high voltage and a second high voltage as a first P channel back bias of a first internal circuit in response to the first P channel control signal, and to provide one of a first low voltage and a second low voltage as a first N channel back bias of the first internal circuit in response to the first N channel control signal; and
  a second back bias switching block configured to provide one of the first high voltage and the second high voltage as a second P channel back bias of a second internal circuit in response to the second P channel control signal, and to provide one of the first low voltage and the second low voltage as a second N channel back bias of the second internal circuit in response to the second N channel control signal,
  wherein the first P channel control signal includes a first high voltage control signal and a second high voltage control signal, and
  wherein the back bias control block is configured to generate the first high voltage control signal having the first low voltage and the second high voltage control signal having the second high voltage in a first operation mode, and to generate the first high voltage control signal having the first high voltage and the second high voltage control signal having the first low voltage in a second operation mode and in a third operation mode.

2. The semiconductor apparatus according to claim 1,
  wherein the first N channel control signal includes a first low voltage control signal and a second low voltage control signal, and
  wherein the back bias control block is configured to generate the first low voltage control signal having the first high voltage and the second low voltage control signal having the second low voltage in the first operation mode and in the second operation mode, and to generate the first low voltage control signal having the first low voltage and the second low voltage control signal having the first high voltage in the third operation mode.

3. The semiconductor apparatus according to claim 2, wherein the second P channel control signal includes a third high voltage control signal and a fourth high voltage control signal, and wherein the back bias control block is configured to generate the third high voltage control signal having the first low voltage and the fourth high voltage control signal having the second high voltage in the first operation mode, and to generate the third high voltage control signal having to the first high voltage and the fourth high voltage control signal having the first low voltage in the second operation mode and in the third operation mode.

4. The semiconductor apparatus according to claim 3, wherein the second N channel control signal includes a third low voltage control signal and a fourth low voltage control signal, and wherein the back bias control block is configured to generate the third low voltage control signal having the first high voltage and the fourth low voltage control signal having the second low voltage in the first operation mode, and to generate the third low voltage control signal having the first low voltage and the fourth low voltage control signal having the first high voltage in the second operation mode and in the third operation mode.

5. The semiconductor apparatus according to claim 4, wherein the first back bias switching block comprises:

a first switch transistor configured to provide the first high voltage as the first P channel back bias of the first internal circuit in response to the first high voltage control signal;

a second switch transistor configured to provide the second high voltage as the first P channel back bias of the first internal circuit in response to the second high voltage control signal;

a third switch transistor configured to provide the first low voltage as the first N channel back bias of the first internal circuit in response to the first low voltage control signal; and a fourth switch transistor configured to provide the second low voltage as the first N channel back bias of the first internal circuit in response to the second low voltage control signal.

6. The semiconductor apparatus according to claim 4, wherein the second back bias switching block comprises:

a fifth switch transistor configured to provide the first high voltage as the second P channel back bias of the second internal circuit in response to the third high voltage control signal;

a sixth switch transistor configured to provide the second high voltage as the second P channel back bias of the second internal circuit in response to the fourth high voltage control signal;

a seventh switch transistor configured to provide the first low voltage as the second N channel back bias of the second internal circuit in response to the third low voltage control signal; and an eighth switch transistor configured to provide the second low voltage as the second N channel back bias of the second internal circuit in response to the fourth low voltage control signal.

7. The semiconductor apparatus according to claim 1, wherein the second high voltage has a relatively higher level than the first high voltage and wherein the second high voltage is a first power supply voltage received from an external device.

8. The semiconductor apparatus according to claim 7, wherein the first high voltage is one of a second power supply voltage and an internal voltage and wherein the second power supply voltage is received from the external device, and wherein the semiconductor apparatus further comprises:

a first high voltage generation block configured to output one of the second power supply voltage and the internal voltage as the first high voltage in response to the operation modes.

9. The semiconductor apparatus according to claim 1, wherein the second low voltage has a relatively lower level than the first low voltage, and wherein the semiconductor apparatus further comprises:

a second low voltage generation block configured to generate the second low voltage.

10. The semiconductor apparatus according to claim 9, wherein the second low voltage generation block comprises a temperature sensor, and is configured to generate the second low voltage with a level based on a temperature.

11. A semiconductor apparatus comprising:

a back bias control block configured to generate a first P channel control signal, a second P channel control signal, a first N channel control signal and a second N channel control signal according to an operation mode based on a command signal;

a first back bias switching block configured to provide one of a first high voltage and a second high voltage as a first P channel back bias of a first internal circuit in response to the first P channel control signal, and to provide one of a first low voltage and a second low voltage as a first N channel back bias of the first internal circuit in response to the first N channel control signal; and a second back bias switching block configured to provide one of the first high voltage and the second high voltage as a second P channel back bias of a second internal circuit in response to the second P channel control signal, and to provide one of the first low voltage and the second low voltage as a second N channel back bias of the second internal circuit in response to the second N channel control signal, wherein the back bias control block comprises:

a mode control unit configured to generate a mode change signal according to the operation mode;

a timer configured to selectively delay the mode change signal according to the operation mode and to output the resultant mode change signal; and a driving unit configured to generate the first P channel control signal, the second P channel control signal, the first N channel control signal and the second N channel control signal in response to the mode change signal.

12. The semiconductor apparatus according to claim 11, wherein the operation modes comprise a normal operation mode and a low power operation mode, and wherein the timer is configured to output the mode change signal when the operation mode is changed from the normal operation mode to the low power operation mode and the low power mode is has been maintained for a predetermined period of time.

13. The semiconductor apparatus according to claim 12, wherein the timer is configured to output the mode change signal without the incorporation of a delay when the operation mode is changed from the low power operation mode to the normal operation mode.

14. The semiconductor apparatus according to claim 11,
wherein the first P channel control signal includes a first high voltage control signal and a second high voltage control signal and the second P channel control signal includes a third high voltage control signal and a fourth high voltage control signal,
wherein the first high voltage control signal and the third high voltage control signal are provided to gates of switch transistors at the first back bias switching block and the second back bias switching block, respectively, and output the first high voltage,
wherein the second high voltage control signal and the fourth high voltage control signal are provided to gates of switch transistors at the first back bias switching block and second back bias switching block, respectively, and output the second high voltage, and
wherein the back bias control block is configured to shift the second high voltage control signal and the fourth high voltage control signal to the level of the second high voltage control signal when the second high voltage control signal and the fourth high voltage control signal have the level of the first high voltage.

15. The semiconductor apparatus according to claim 11,
wherein the first N channel control signal includes a first low voltage control signal and a second low voltage control signal, the second N channel control signal includes a third low voltage control signal and a fourth low voltage control signal,
wherein the first low voltage control signal and the third low voltage control signal are provided to gates of switch transistors at the first back bias switching block and the second back bias switching block, respectively, and output the first low voltage,
wherein the second low voltage control signal and the fourth low voltage control signal are provided to gates of switch transistors at the first back bias switching block and the second back bias switching block, respectively, and output the second low voltage, and
wherein the back bias control block is configured to shift the second low voltage control signal and the fourth low voltage control signal to the level of the second low voltage when the second low voltage control signal and the fourth low voltage control signals have the level of the first low voltage.

16. The semiconductor apparatus according to claim 14, wherein the back bias control block is configured to generate the first N channel control signal and the second N channel control signal having substantially the same level in a first operation mode and in a third operation modes, and to generate the first N channel control signal and the second N channel control signal having different levels in a second operation mode.

17. A semiconductor apparatus comprising:
a back bias control block configured to generate a first P channel control signal, a second P channel control signal, a first N channel control signal and a second N channel control signal according to an operation mode based on a command signal;
a first back bias switching block configured to provide one of a first high voltage and a second high voltage as a first P channel back bias of a first internal circuit in response to the first P channel control signal, and to provide one of a first low voltage and a second low voltage as a first N channel back bias of the first internal circuit in response to the first N channel control signal; and
a second back bias switching block configured to provide one of the first high voltage and the second high voltage as a second P channel back bias of a second internal circuit in response to the second P channel control signal, and to provide one of the first low voltage and the second low voltage as a second N channel back bias of the second internal circuit in response to the second N channel control signal,
wherein the back bias control block is configured to generate the first P channel control signal and the second P channel control signal having substantially the same level in a first operation mode and in a third operation mode, and to generate the first P channel control signal and the second P channel control signal having different levels in a second operation mode.

* * * * *